US006381271B1

(12) United States Patent
Jäverbring

(10) Patent No.: US 6,381,271 B1
(45) Date of Patent: Apr. 30, 2002

(54) LOW COMPLEXITY DECISION FEEDBACK SEQUENCE ESTIMATION

(75) Inventor: Stefan Jäverbring, Älvsjö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/134,906

(22) Filed: Aug. 17, 1998

(51) Int. Cl.[7] .............................................. H04L 27/22
(52) U.S. Cl. ...................... 375/233; 375/262; 375/341; 375/346; 375/350
(58) Field of Search ................................ 375/233, 215, 375/221, 284, 285, 232, 267, 295, 316, 347, 262, 346, 348, 350, 341; 370/331, 337; 455/101, 132, 133, 134, 135, 136, 98, 75, 130

(56) References Cited

U.S. PATENT DOCUMENTS

| | | |
|---|---|---|
| 5,091,918 A | 2/1992 | Wales |
| 5,131,011 A | 7/1992 | Bergmans et al. |
| 5,132,988 A | 7/1992 | Fisher et al. |
| 5,251,233 A * | 10/1993 | Labedz et al. ................. 375/12 |
| 5,272,726 A * | 12/1993 | Furuya et al. ................. 375/94 |
| 5,349,608 A | 9/1994 | Graham et al. |
| 5,363,408 A | 11/1994 | Paik et al. |
| 5,430,661 A | 7/1995 | Fisher et al. |
| 5,432,821 A | 7/1995 | Polydoros et al. |
| 5,572,503 A | 11/1996 | Satoh et al. |
| 5,581,581 A * | 12/1996 | Sato ............................. 375/341 |
| 5,594,756 A | 1/1997 | Sakurai et al. |
| 5,673,291 A | 9/1997 | Dent |
| 5,684,832 A | 11/1997 | Adachi et al. |
| 5,790,606 A | 8/1998 | Dent |
| 5,870,433 A * | 2/1999 | Huber et al. ................. 375/233 |
| 6,249,544 B1 * | 6/2001 | Azazzi et al. ............... 375/233 |

FOREIGN PATENT DOCUMENTS

EP 0769853 A1 4/1997

OTHER PUBLICATIONS

Hans C. Guren, et al., "Decision Feedback Sequence Estimation for Continuous Phase Modulation on a Linear Multipath Channel," IEEE Transactions on Communications vol. 41, No. 2, Feb. 1993, pp. 280–284.
John G. Kenney, et al., "A Parallel Architecture for Multilevel Decision Feedback Equalization," IEEE Transactions on Magnetics, vol. 34, No. 2, Mar. 1998, pp. 588–595.
Alexandra Duel–Hallen, et al., "Delayed Decision–Feedback Sequence Estimation," IEEE Transactions on Communications, vol. 37, No. 5, May 1989, pp. 428–436.

* cited by examiner

Primary Examiner—Chi Pham
Assistant Examiner—Dung X. Nguyen
(74) Attorney, Agent, or Firm—Burns, Doane, Swecker & Mathis, L.L.P.

(57) ABSTRACT

A Decision Feedback Sequence Estimator (DFSE) metric is determined by storing one or more tables of Decision Feedback Estimation (DFE) hypotheses in a memory, and then using values of the DFE hypotheses that are retrieved from storage to determine the DFSE metric. The DFE hypotheses may be precalculated and stored into the memory prior to performance of any retrieval operation. Alternatively, the table may start out empty, and the DFE hypotheses may be determined as needed for a particular DFSE metric computation. The determined DFE metric may then be stored into a table for later retrieval if the metric is needed again. The DFE hypotheses may be stored into a single table or, to reduce memory requirements and computational complexity, may be stored into corresponding ones of plural tables. MLSE hypotheses, which are also used in the DFSE metric determination, may similarly be stored into one or more tables for later retrieval as needed.

22 Claims, 5 Drawing Sheets

LOW COMPLEXITY DECISION FEEDBACK SEQUENCE ESTIMATION

BACKGROUND

The present invention relates to Decision Feedback Sequence Estimation.

In a cellular Time Division Multiple Access (TDMA) system, Inter-Symbol Interference (ISI) introduced by bandwidth limited modulation and a multipath radio channel is removed by a channel equalizer. The radio channel in such a system (including the transmitter and receiver filter) can usually be modeled by:

$$b(k) = \sum_{j=0}^{L} a(k-j) \cdot h(j) + n(k), \quad (1)$$

where b(k) are the received symbol spaced signal samples and h(j) are the taps of a time discrete baseband model of the multipath channel, that is, a model of the ISI introduced by the channel and filters. The variable a(k−j) represents the transmitted symbols and n(k) is additive white Gaussian noise. The channel influence on h will change with time, but can be modeled to be constant under a short enough time interval.

Between the time that symbols, a(k) are generated at a transmitter and the time they are recreated (estimated) at a receiver, they may be altered by various mechanisms. For example, as illustrated in FIG. 1a, at the transmitter the symbols a(k) may first be modified by a transmitter filter 101. The transmitted signal may then undergo further modification by means of a multipath channel 103, before it is received by a receiver filter 105. The received signal, b(t) must then be converted into digital form by a sampling circuit 107, which generates distorted samples b(k). The distorted samples b(k) are then supplied to an equalizer 109, which finally generates the estimated symbols â(k).

At the receiver, the transmitter filter 101, multipath channel 103, receiver filter 105 and sampling circuit 107 are usually modeled as a time discrete finite impulse response (FIR) filter 111, as illustrated in FIG. 1b. The FIR filter 111 is estimated to have an estimated response, ĥ, that operates on the transmitted symbols, a(k), in accordance with equation (1). The estimated response, ĥ, is used by the succeeding equalizer 109 in a process that generates estimated symbols, â(k), based on the received distorted samples, b(k). FIGS. 1a and 1b illustrate a linear modulation scheme, but continuous phase modulations, such as that used in GSM systems, can as well often be interpreted this way by the receiver.

The equalizer 109 may operate in accordance with any of a number of known symbol estimation techniques. If the goal is to minimize symbol sequence error, a Maximum Likelihood Sequence Estimator (MLSE) provides optimum performance. In the MLSE, the symbol sequence which minimizes the Euclidean distance between the symbol sequence filtered through the channel, and the received sample sequence is found. Assuming white Gaussian noise, this symbol sequence is the most probable one. If the Viterbi algorithm is used to implement the MLSE, the sequence is found in a step-by-step iterative technique that involves calculating metrics. Some of the components in these metrics only depend on the symbol alphabet and the channel estimate. Since these components are used many times in the Viterbi algorithm and are independent of the received samples, they can be pre-calculated once per channel estimate, and stored in tables, thus saving complexity. This is described, for example, in U.S. Pat. No. 5,091,918, which issued to Wales on Feb. 25, 1992. The same approach is possible for a Maximum A Posteriori (MAP) equalizer since the same metrics are needed. It is noted that a non-simplified MAP symbol-by-symbol equalizer can offer lower symbol error rate, and can also provide somewhat better soft values and hence improve the decoded performance.

Examined more closely, conventional MLSE techniques operate by hypothesizing candidate sequences, and for each candidate sequence calculating metrics in the form $$dM = \left| y(k) - \sum_{j=0}^{L_{MLSE}} a(k-j) \cdot \hat{h}(j) \right|^2, \quad (2)$$

where y(k) are the received samples, a(k) are the symbols of a candidate sequence, $L_{MLSE}+1$ is the number of MLSE taps in the equalizer window, and ĥ(j) is the channel estimate. Since a(k−j) and ĥ(j) are independent of the received signal, it is possible to reduce the number of computations for a given channel estimate by calculating the hypothesized received sample values (i.e., the sum in equation 2, henceforth referred to as a hypothesis) for all possible hypothesized symbols, and storing these precalculated sums in a memory. These precalculated values, which are retrieved as needed to determine a branch metric (dM) for a particular received sample y(k), are used many times in the equalization process. Since all $M^{L_{MLSE}+1}$ branch metrics (dM) are needed per sample, computations are always saved using precalculation.

An example is shown below in Table 1. In this example, let the channel be h=[2 j], and let $L_{MLSE}+1=2$. Assume that the symbol alphabet is a(k)={−1,1,−j,j} (e.g., Quadrature Phase Shift Keying, or QPSK). The possible hypotheses, A(k), then become those shown in Table 1:

TABLE 1

| a(k) | a(k − 1) | A(k) = h(0)*a(k) + h(1)*a(k − 1) = 2*a(k) + j*a(k − 1) |
|---|---|---|
| −1 | −1 | −2 − j |
| −1 | +1 | −2 + j |
| −1 | −j | −1 |
| −1 | +j | −3 |
| +1 | −1 | 2 − j |
| +1 | +1 | 2 + j |
| +1 | −j | 3 |
| +1 | +j | 1 |
| −j | −1 | −3j |
| −j | +1 | −j |
| −j | −j | 1 − 2j |
| −j | +j | −1 − 2j |
| +j | −1 | 3j |
| +j | +1 | 1 + 2j |
| +j | −j | −1 + 2j |
| +j | +j | j |

It will be observed that A(k) is independent of k, and can be re-used for all samples. It is apparent that complexity can be saved by setting up this table once per channel estimate.

Despite the complexity savings from using precalculated hypotheses in a look-up table, the MLSE algorithm can become computationally intense as the size of the equalization window (i.e., the number of taps in the channel model) grows, and also as higher order modulation is used, because the complexity is proportional to (#Symbols in modulation alphabet)$^{Window\ Size}$. The need for such growth is driven by the evolution into higher symbol transmission rates, which are being proposed in order to offer high bit rates in future communications systems. The Enhanced Data rates for Global Evolution (EDGE) cellular telecommunications standard is one such system in which higher level modulation (HLM) is proposed. A known alternative equalization technique that requires fewer computations, and which therefore may be suitable for use in such new communications standards, is Decision Feedback Estimation (DFE). Unlike MLSE, which uses a sequence detection strategy, DFE detects symbols on a symbol-by-symbol basis. This is accomplished by first estimating a value that represents the signal energy presently experienced from previously decoded symbols. This energy value is then subtracted from a current received sample, in order to cancel out ISI. Because the energy value is determined from an estimate of the channel response and from previously decoded symbols, the form of energy value computation resembles that of the MLSE's hypothesis computation. However, because calculating the energy value for DFE need only be performed for previously decoded symbols (i.e., the previously generated final output symbols from the DFE), as opposed to a complete set of hypothesized symbol sequences in the case of MLSE, computational complexity of the DFE approach is substantially less than that for MLSE.

As one would expect, the relatively lower computational complexity of DFE is accompanied by a relatively higher symbol error rate, when compared to the MLSE approach. It is nonetheless preferable to MLSE in some cases because the total storage (complexity) of the MLSE algorithm is proportional to the number of states of the trellis which grows exponentially with the channel memory length. When the channel memory becomes large (it can be infinite), the MLSE algorithm becomes impractical.

A compromise solution may be found in the form of a Decision Feedback Sequence Estimator (DFSE). DFSEs are known, and are described in, for example, A. Duel-Hallen et al., "Delayed Decision-Feedback Sequence Estimation", *IEEE Transactions on Communications*, pp. 428–436, vol. 37, No. 5, May 1989. The complexity of a DFSE is controlled by a parameter $\mu$ that can be varied from zero to the size of the memory of the channel. The algorithm is based on a trellis with the number of states being exponential in $\mu$. When $\mu=0$, DFSE reduces to the DFE. When the memory of the channel is finite, DFSE with maximal complexity is equivalent to the Viterbi algorithm. For the intermediate values of $\mu$, DFSE can be described as a reduced-state Viterbi algorithm with feedback incorporated into the structure of path metric computations.

Thus, for a given window size, DFSE can be significantly less complex than the MLSE approach. The basic principle is to divide the channel taps into one MLSE part 201 of relatively high complexity, and one DFE part 203 having relatively lower complexity, as shown in FIG. 2. That is, for a DFSE the channel estimate is divided into two parts: $\{\hat{h}(0), \ldots, \hat{h}(L_{MLSE})\}$, which are the channel estimates for the MLSE taps 201, and $\{\hat{h}(L_{MLSE}+1), \ldots, \hat{h}(L_{MLSE}+L_{DFE})\}$, which are the channel estimates for the DFE taps 203, as shown in FIG. 2. The branch metrics then become $$dM = \left| y(k) - \sum_{j=0}^{L_{MLSE}} a(k-j) \cdot \hat{h}(j) - \sum_{j=L_{MLSE}+1}^{L_{MLSE}+L_{DFE}} \bar{a}(k-j) \cdot \hat{h}(j) \right|^2 \quad (3)$$

where $\bar{a}(k)$ are the old tentative symbol decisions corresponding to the path into a state and $L_{DFE}$ is the number of feedback taps. It will be apparent that the tentative symbol decisions used in calculating a DFSE metric may differ from one decoding trellis path to another. Observe that the size of the equalization window is $L_{MLSE}+L_{DFE}$. For a given equalization window size, the trellis memory, and hence the number of states and metric computations, for DFSE can be substantially less than that of an MLSE.

The prior art does not specifically discuss practical implementations of a DFSE. The obvious brute force method is to calculate the second sum in equation 3 whenever encountered. Such an implementation, however, can entail a great deal of complexity in terms of computations and memory.

SUMMARY

It is therefore an object of the present invention to provide a DFSE that exhibits reduced computational complexity and/or memory requirements.

In accordance with one aspect of the present invention, the foregoing and other objects are achieved in a DFSE metric determination apparatus and method in which one or more tables of Decision Feedback Estimation (DFE) hypotheses are stored in a memory. DFE hypotheses are retrieved from the one or more tables of DFE hypotheses, and are used to determine the DFSE metric. The memory may, for example, be a single memory device or a plurality of memory devices.

In some embodiments, the DFE hypotheses may be pre-calculated for storage into the memory prior to performance of any steps of retrieving DFE hypotheses from the one or more tables of DFE hypotheses. In alternative embodiments, the one or more tables may start out empty. Then, DFSE metric determination includes determining whether a desired DFE hypothesis is not presently stored in the memory. If it is not, the DFE hypothesis is calculated, stored into the memory, and used to determine the DFSE metric. If that DFE hypothesis is later needed for another DFSE metric computation, it may then be retrieved from the table.

In accordance with another aspect of the invention, instead of a single table, a number, M, of tables of DFE hypotheses may stored in the memory, wherein M>1, and wherein each of the M tables of DFE hypotheses stores a corresponding one of M groups of DFE hypotheses. In this case, the step of using retrieved values of the DFE hypotheses to determine the DFSE metric includes the step of using retrieved values of the DFE hypotheses from each of the M tables to determine the DFSE metric.

In still another aspect of the invention, MLSE hypotheses may also be stored into one or more tables, so that values may later be retrieved for use during the determination of a DFSE metric. In order to reduce memory requirements, the MLSE hypotheses may be stored into a number, $M_{MLSE}$, of tables in a memory, wherein $M_{MLSE}>1$.

BRIEF DESCRIPTION OF THE DRAWINGS

The objects and advantages of the invention will be understood by reading the following detailed description in conjunction with the drawings in which.

DETAILED DESCRIPTION

Figure 1A:
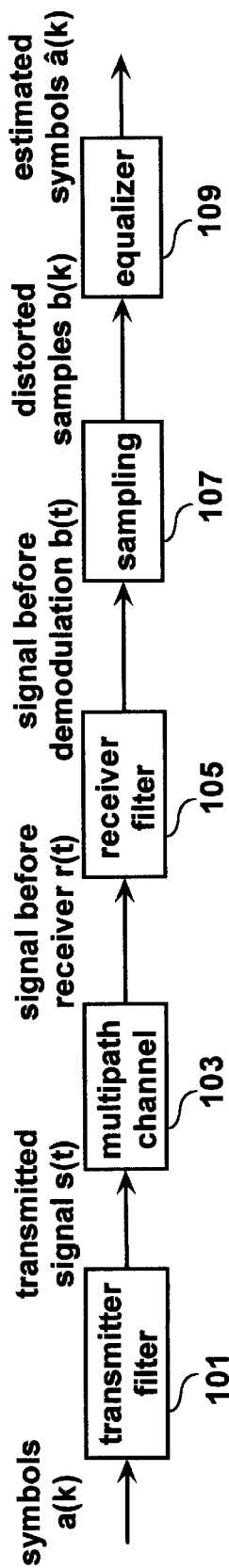
FIG. 1*a* is a block diagram of a transmission path of a transmitted symbol, a(k), as it is transformed by transmitter equipment, a multipath channel, and receiver equipment.
Figure 1B:
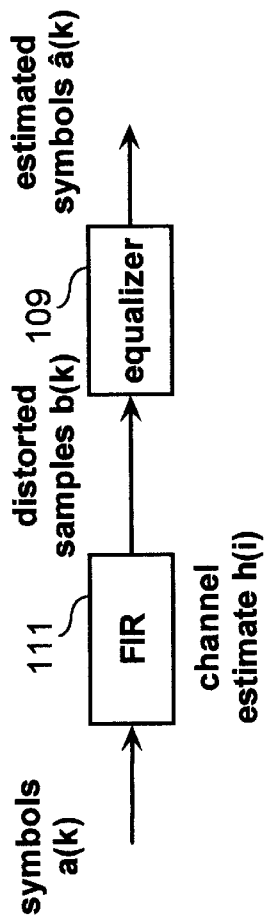
FIG. 1*b* is a block diagram of a finite impulse response (FIR) model of the transmitter filter, multipath channel, receiver filter and down-sampling circuit.
Figure 2:
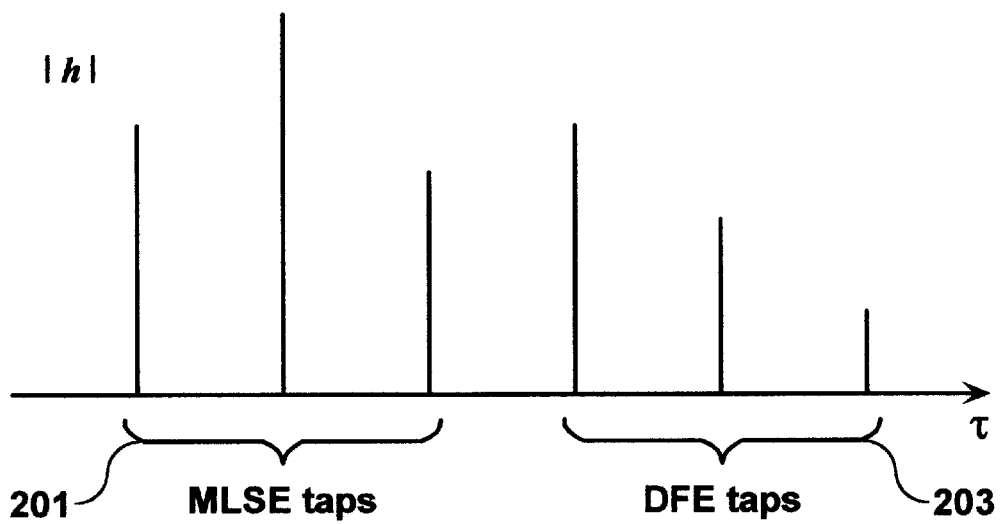
FIG. 2 is a graph of a DFSE equalizer window of a channel impulse response, showing the division of the channel impulse response into MLSE taps and DFE taps.

The various features of the invention will now be described with respect to the figures, in which like parts are identified with the same reference characters.

This invention describes techniques for minimizing complexity of the MLSE and DFE parts of a DFSE. These techniques can be used both for a pure DFSE, as well as for a simplified MAP equalizer with a DFSE structure. The techniques described herein are best described in connection with flowcharts that depict the various steps to be performed in accordance with various aspects of the invention. It will be appreciated that these steps may be performed by otherwise well-known hardware that has been adapted to function in accordance with the invention. For example, many types of computer-readable memory/storage devices (such as a Random Access Memory, or RAM), may serve as the means for storing the various tables described herein, while a suitably programmed computer processor may be used as means for performing the various table storage and retrieval steps, as well as the various computational and analytical steps described herein. Although reference will be made to a "memory" throughout this disclosure, it will be understood that this term may refer to arrangements of plural memory devices, as well as to single memory devices. Techniques for selecting suitable hardware (e.g., memory plus processing hardware), as well as for generating and running suitable programs for embodying the invention based on the teachings herein, are well-known in the art, and need not be described here in further detail.

Figure 3:
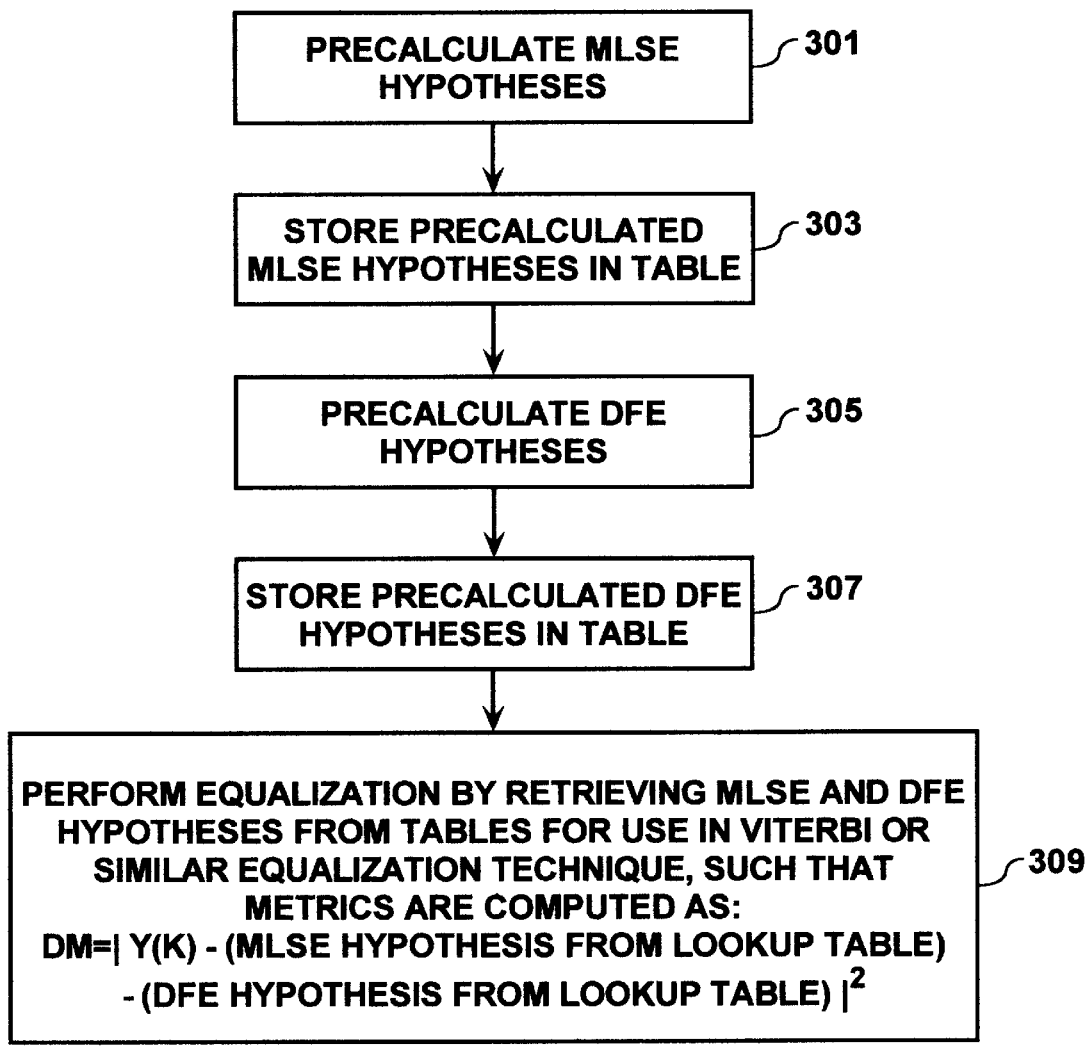
FIG. 3 is a flowchart that depicts the steps for equalizing a received signal in accordance with one aspect of the invention.

FIG. 3 is a flowchart, depicting the steps for equalizing a received signal in accordance with one aspect of the invention. Here it is assumed that the channel estimates are constant for all received signals. At step 301, all MLSE hypotheses are precalculated in accordance with $$\sum_{j=0}^{L_{MLSE}} a(k-j) \cdot \hat{h}(j) \qquad (4)$$

for all combinations of MLSE symbols. The precalculated MLSE hypotheses are then stored in a look-up table (step 303). Since there are $N_a^{L_{MLSE}+1}$ combinations, where $N_a$ is the number of symbols in the symbol alphabetic, the look-up table will contain $N_a^{L_{MLSE}+1}$ rows.

Next, at step 305, all DFE hypotheses are precalculated in accordance with $$\sum_{j=L_{MLSE}+1}^{L_{MLSE}+L_{DFE}} a(k-j) \cdot \hat{h}(j). \qquad (5)$$

The precalculated DFE hypotheses are then stored in a look-up table (step 307). There are $N_a^{L_{DFE}}$ combinations, and hence the look-up table must be capable of storing $N_a^{L_{DFE}}$ rows.

Steps 301, 303, 305 and 307 need be performed only once for a given channel estimate, and are performed in advance of the actual equalization steps. Subsequent to these steps, in the actual DFSE (using the Viterbi algorithm or similar), the metrics are calculated from values obtained from the look-up table(s) (step 309), rather than those obtained by actually performing the various sum calculations specified in equation 3. That is, the metrics are determined in accordance with $$dM = |y(k) - (\text{MLSE hypothesis from look-up table}) - (\text{DFE hypothesis from look-up table})|^2 \qquad (6)$$

The DFSE may continue to use values from the look-up table(s) for so long as the channel estimate used in the precalculation steps remains valid.

Figure 4:
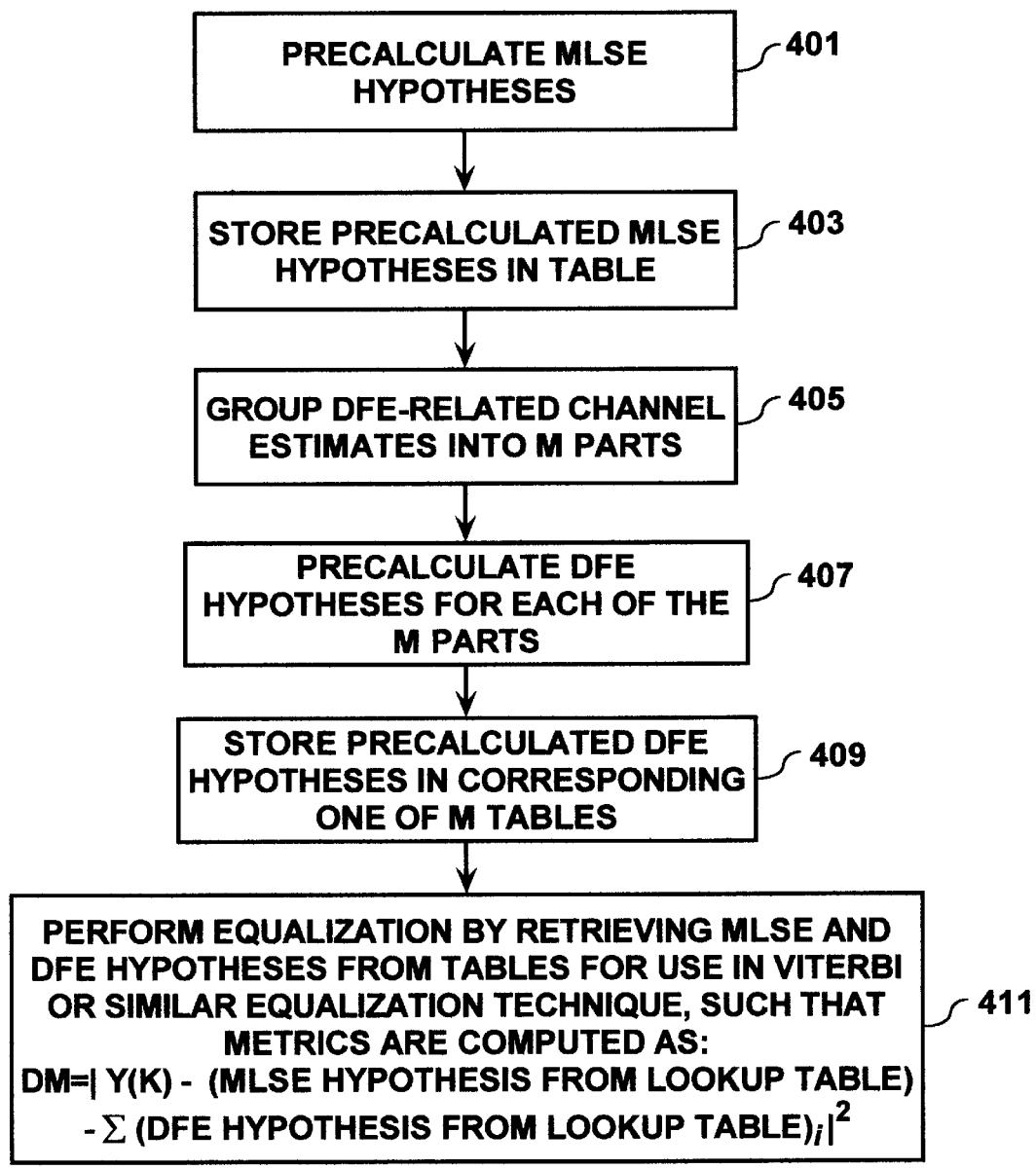
FIG. 4 is a flowchart that depicts the steps for equalizing a received signal in accordance with another aspect of the invention.

In accordance with another aspect of the invention, the memory requirements and/or computational complexity of a DFSE may be reduced. Referring now to the flowchart of FIG. 4, the MLSE hypotheses are precalculated (step 401) and stored in a look-up table (step 403) as before. The DFE part of the impulse response, however, is divided into M parts. That is, the impulse response $\{\hat{h}(L_{MLSE}+1), \ldots, \hat{h}(L_{MLSE}+L_{DFE})\}$ is divided into $$\{\hat{h}(L_{LMSE}+1), \ldots, \hat{h}(L_{LMSE}+m_1)\}, \ldots, \{\hat{h}(L_{LMSE}+m_1+\ldots+m_{M-1}+1), \ldots, \hat{h}(L_{MLSE}+m_1+\ldots+m_M)\}, \qquad (7)$$

where $m_i$ is the number of taps in part i. Hence, $$\sum_{i=1}^{M} m_i = L_{DFE}. \qquad (8)$$

In this embodiment, M tables will be used. For each table i, the corresponding part of the DFE hypotheses is precalculated (step 407) in accordance with $$\sum_{j=L_{MLSE}+z_i}^{L_{MLSE}+z_i+m_i} a(k-j) \cdot \hat{h}(j), \qquad (9)$$

where $$z_i = 1 + \sum_{j=1}^{i-1} m_j \qquad (10)$$

It follows that each table i must be capable of storing $N_a^{m_i}$ rows. The precalculated DFE hypotheses are then stored in corresponding ones of the M tables (step 409).

Following the precalculation steps (401, 403, 405, 407 and 409), equalization of the received signal is performed in the DFSE by using a Viterbi or similar technique, where the metrics are calculated in accordance with:

$$dM = \left| y(k) - (MLSE \text{ hypothesis from look-up table}) - \sum_{i=1}^{M} (DFE \text{ hypothesis from look-up table})_i \right|^2 \qquad (11)$$

The term "burst" will be used herein to refer to those symbols for which a channel estimate is valid. It follows that the same look-up table(s) can be used for all symbols in the same burst. The total computational complexity will partly be independent of the number of symbols in a burst (i.e., the precalculations of the tables), and partly proportional to the number of symbols in the burst (i.e., putting precalculated values together into a metric). Dividing the DFE look-up table into sub-tables decreases the number of computations that are independent of the number of symbols, and increases the number of computations that are proportional to the number of symbols. The number of sub-tables (M) that minimizes the complexity will therefore depend on the number of symbols in a burst.

The gains of first using the look-up table for the DFE part at all, and second of dividing it into sub-tables are illustrated in the following example:

Assume that there are eight complex symbols in the symbol alphabet, such as in 8-PSK. Further assume that there are 2 MLSE taps and 4 DFE taps (a total of 6 equalizing taps), and that a look-up table for the MLSE part is used. Let there be two cases: one where there are 100 symbols in a burst and one with there are 2000 in a burst. Depending on the number of DFE look-up tables (no look-up tables, one single look-up table or two look-up tables with two DFE taps in each), there will be different numbers of required computations (real multiplications and additions), including the precalculations of look-up tables, and different memory requirements for the tables. The memory requirements are defined as the number of rows in the table. Each row will contain one complex value. This is illustrated in Table 2 below.

TABLE 2

|  | No DFE look-up tables | Single DFE look-up table | Two DFE look-up tables |
|---|---|---|---|
| Rows in MLSE table | 64 | 64 | 64 |
| Computations for pre-calculation of MLSE table | 770 | 770 | 770 |
| Rows in DFE table, per table | 0 | 4,096 | 64 |
| Rows in DFE tables, total | 0 | 4,096 | 128 |
| Comp. for precalc. of DFE table, per table | 0 | 98,310 | 770 |
| Comp for precalc. DFE tables, total | 0 | 98,310 | 1540 |
| Comp. for calculation of metrics, per symbol | 2,240 | 320 | 448 |
| Comp. for calculation of metrics, for 100 symbols | 224,000 | 32,000 | 44,800 |
| Comp. for calculation of metrics, for 2000 symbols | 4,480,000 | 640,000 | 896,000 |
| Total number of comp. for 100 symbols (incl. pre-calc. of tables) | 224,770 (100%) | 131,080 (58%) | 47,110 (21%) |
| Total number of comp. for 2000 symbols | 4,480,770 (100%) | 739,080 (16%) | 898,310 (20%) |

In this example, using the number of computations associated with the brute force method as a baseline, the complexity decrease for the 100 symbols per burst case is 42% with one single DFE look-up table, and 79% with two sub-tables. For the 2000 symbol per burst case, the decrease is 84% with one single DFE look-up table, and 80% with two sub-tables. Observe that in the 100 symbols per burst case, the use of two DFE look-up tables (opposed to just one) is the least computationally complex, whereas in the 2000 symbols per burst case the use of a single DFE look-up table is the least computationally complex. Regardless of the number of symbols per burst, however, memory is always saved by using several sub-tables.

In yet another aspect of the invention, a similar approach may be applied with respect to the MLSE part of the DFSE technique. This technique will now be described with reference to the flowchart of FIG. 5. In this embodiment, at step 501, the MLSE part of the impulse response is divided up into $M_{MLSE}$ parts, so that $\{\hat{h}(0), \ldots, \hat{h}(L_{MLSE})\}$ is divided into $$\{\hat{h}(0), \ldots, \hat{h}(m_1-1)\}, \ldots, \{\hat{h}(m_1+ \ldots +m_{M_{MLSE}-1}), \ldots, \hat{h}(m_1+ \ldots +m_{M_{MLSE}}-1)\}, \quad (12)$$

where $m_i$ is the number of taps in part i. Hence $$\sum_{i=1}^{M_{MLSE}} m_i = L_{MLSE} + 1. \quad (13)$$

There will be $M_{MLSE}$ tables. For each table i, the corresponding part of the MLSE hypotheses is precalculated (step 503) in accordance with $$\sum_{j=z_i}^{z_i+m_i-1} a(k-j) \cdot \hat{h}(j), \quad (14)$$

where $$z_i = \sum_{k=1}^{i-1} m_k \quad (15)$$

Table i must therefore be capable of storing $N_a^{m_i}$ rows.

The precalculated MLSE hypotheses are then stored into corresponding ones of the $M_{MLSE}$ tables (step 505).

Figure 5:
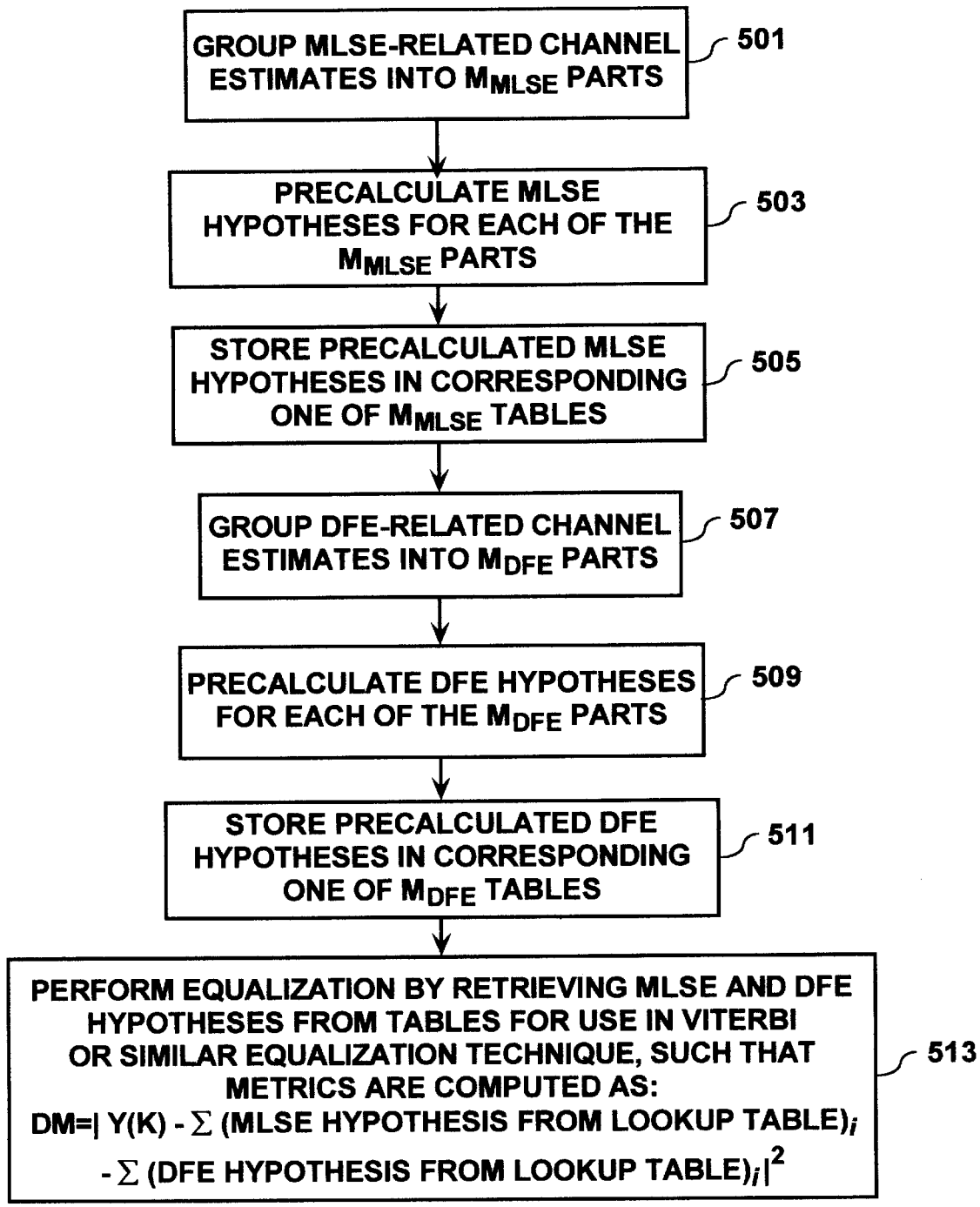
FIG. 5 is a flowchart that depicts the steps for equalizing a received signal in accordance with yet another aspect of the invention.

The DFE part of this embodiment of a DFSE equalization process may optionally also include the use of sub-tables, as described earlier. Thus, as illustrated in FIG. 5, the DFE part of the impulse response is divided into $M_{DFE}$ parts (step 507), as shown above in equation 7. For each table i, the corresponding part of the DFE hypotheses is precalculated (step 509) in accordance with equations 9 and 10. The precalculated DFE hypotheses are then stored in corresponding ones of the $M_{DFE}$ tables (step 511).

Following the precalculation steps (501, 503, 505, 507, 509 and 511), equalization of the received signal is performed in the DFSE by using a Viterbi or similar technique, where the metrics are calculated in accordance with:

$$dM = \left| y(k) - \sum_{i=1}^{M_{MLSE}} (MLSE \text{ hypothesis from look-up table}) - \sum_{i=1}^{M_{DFE}} (DFE \text{ hypothesis from look-up table})_i \right|^2 \quad (16)$$

Since it is always the case that all $N_a^{L_{MLSE}+1}$ possible MLSE hypotheses are needed for every symbol, it is always more computationally complex to use MLSE sub-tables instead of just one MLSE table, regardless of the burst length. However, memory is always saved. Hence this third embodiment offers the ability to make tradeoffs between memory requirements and computational complexity.

In still another aspect of the invention, a further refinement can be made to each of the above-described embodiments by starting the equalization process with empty DFE sub-tables, regardless of the number of DFE sub-tables (i.e., by not precalculating the DFE hypotheses). Whenever a new symbol combination for a DFE part occurs, the hypothesis is calculated, used in the metric computations and then stored in the appropriate table. If the hypothesis for the same symbol combination is needed later, it is fetched from the look-up table.

The table will be empty to start with, and continuously filled during the equalization of a burst. The total computational complexity will be decreased, but the amount of the decrease will depend on how many different DFE hypotheses are actually needed for the particular data that is being equalized.

The invention significantly decreases the computational complexity of the DFSE equalizer. A numerical example is that for a typical DFSE for higher order modulation, the number of multiplications can be reduced by approximately 50–75%, depending on system parameters. The above-described techniques also offer the possibility of making tradeoffs between the memory requirements and the computational complexity, if necessary.

The invention can be applied in a pure DFSE as well as in a MAP equalizer with a DFSE structure.

The invention has been described with reference to a particular embodiment. However, it will be readily apparent to those skilled in the art that it is possible to embody the invention in specific forms other than those of the preferred embodiment described above. This may be done without departing from the spirit of the invention. For example, significant aspects of the invention may be embodied as a computer readable storage medium (e.g., diskette or other magnetic storage media, compact disk) having stored therein signals for causing a digital programmable computer to carry out the various analytical as well as table storage and retrieval steps described above.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. An apparatus for use in a Decision Feedback Sequence Estimator (DFSE), the apparatus comprising:

a memory for storing one or more tables of Decision Feedback Estimation (DFE) hypotheses;

means for retrieving DFE hypotheses from the one or more tables of DFE hypotheses;

means for using retrieved values of the DFE hypotheses to determine a DFSE metric; and means for precalculating the DFE hypotheses and storing the precalculated DFE hypotheses into the memory prior to operation of the means for retrieving DFE hypotheses from the one or more tables of DFE hypotheses.

2. The apparatus of claim 1, wherein the means for using retrieved values of the DFE hypotheses to determine a DFSE metric comprises:

means for determining that a desired DFE hypothesis is not presently stored in the memory;

means for determining the desired DFE hypothesis that is not presently stored in the memory;

means for storing the determined desired DFE hypothesis into the memory; and means for using the determined desired DFE hypothesis to determine the DFSE metric.

3. The apparatus of claim 1, wherein:

the memory stores a number, M, of tables of DFE hypotheses, wherein M>1;

each of the M tables of DFE hypotheses stores a corresponding one of M groups of DFE hypotheses; and the means for using retrieved values of the DFE hypotheses to determine the DFSE metric uses retrieved values of the DFE hypotheses from each of the M tables to determine the DFSE metric.

4. The apparatus of claim 1, wherein the memory comprises a plurality of memory devices.

5. The apparatus of claim 1, wherein the memory comprises a single memory device.

6. An apparatus for use in a Decision Feedback Sequence Estimator (DFSE), the apparatus comprising:

a memory for storing a number, $M_{MLSE}$, of tables of Maximum Likelihood Sequence Estimation (MLSE) hypotheses, wherein $M_{MLSE}>1$;

means for retrieving MLSE hypotheses from the $M_{MLSE}$ tables of MLSE hypotheses; and means for using retrieved values of the MLSE hypotheses from each of the $M_{MLSE}$ tables of MLSE hypotheses to determine a DFSE metric, wherein:
   the memory is further for storing one or more tables of Decision Feedback Estimation (DFE) hypotheses;
   the apparatus further comprises means for retrieving DFE hypotheses from the one or more tables of DFE hypotheses; and
   the means for using retrieved values of the MLSE hypotheses to determine the DFSE metric further utilizes retrieved values of the DFE hypotheses to determine the DFSE metric, and wherein the apparatus further comprises:
   means for precalculating the DFE hypotheses and storing the precalculated DFE hypotheses into the memory prior to operation of the means for retrieving DFE hypotheses from the one or more tables of DFE hypotheses.

7. The apparatus of claim 6, wherein the means for using retrieved values of the DFE hypotheses to determine the DFSE metric comprises:

means for determining that a desired DFE hypothesis is not presently stored in the memory;

means for determining the desired DFE hypothesis that is not presently stored in the memory;

means for storing the determined desired DFE hypothesis into the memory; and means for using the determined desired DFE hypothesis to determine the DFSE metric.

8. The apparatus of claim 6, wherein:

the memory stores a number, $M_{DFE}$, of tables of DFE hypotheses, wherein $M_{DFE}>1$;

each of the $M_{DFE}$ tables of DFE hypotheses stores a corresponding one of $M_{DFE}$ groups of DFE hypotheses; and the means for using retrieved values of the DFE hypotheses to determine the DFSE metric uses retrieved values of the DFE hypotheses from each of the $M_{DFE}$ tables to determine the DFSE metric.

9. The apparatus of claim 6, wherein the memory comprises a plurality of memory devices.

10. The apparatus of claim 6, wherein the memory comprises a single memory device.

11. A method of determining a Decision Feedback Sequence Estimator (DFSE) metric, comprising the steps of:
- storing one or more tables of Decision Feedback Estimation (DFE) hypotheses in a memory;
- retrieving DFE hypotheses from the one or more tables of DFE hypotheses;
- using retrieved values of the DFE hypotheses to determine the DFSE metric; and
- precalculating the DFE hypotheses and storing the precalculated DFE hypotheses into the memory prior to performance of the step of retrieving DFE hypotheses from the one or more tables of DFE hypotheses.

12. The method of claim 11, wherein the step of using retrieved values of the DFE hypotheses to determine a DFSE metric comprises the steps of:
- determining that a desired DFE hypothesis is not presently stored in the memory;
- determining the desired DFE hypothesis that is not presently stored in the memory;
- storing the determined desired DFE hypothesis into the memory; and
- using the determined desired DFE hypothesis to determine the DFSE metric.

13. The method of claim 11, wherein:
- the step of storing one or more tables of Decision Feedback Estimation (DFE) hypotheses in the memory comprises the step of storing a number, M, of tables of DFE hypotheses in the memory, wherein M>1, and wherein each of the M tables of DFE hypotheses stores a corresponding one of M groups of DFE hypotheses; and
- the step of using retrieved values of the DFE hypotheses to determine the DFSE metric includes the step of using retrieved values of the DFE hypotheses from each of the M tables to determine the DFSE metric.

14. A method of determining a Decision Feedback Sequence Estimator (DFSE) metric, the method comprising the steps of:
- storing a number, $M_{MLSE}$, of tables of Maximum Likelihood Sequence Estimation (MLSE) hypotheses into a memory, wherein $M_{MLSE}>1$;
- retrieving MLSE hypotheses from the $M_{MLSE}$ tables of MLSE hypotheses;
- using retrieved values of the MLSE hypotheses from each of the $M_{MLSE}$ tables of MLSE hypotheses to determine the DFSE metric;
- storing one or more tables of Decision Feedback Estimation (DFE) hypotheses into the memory; and
- retrieving DFE hypotheses from the one or more tables of DFE hypotheses, and wherein:
- the step of using retrieved values of the MLSE hypotheses to determine the DFSE metric comprises the step of utilizing retrieved values of the MLSE hypotheses and retrieved values of the DFE hypotheses to determine the DFSE metric; and
- the method further comprising the steps of precalculating the DFE hypotheses and storing the precalculated DFE hypotheses into the memory prior to performance of the step of retrieving DFE hypotheses from the one or more tables of DFE hypotheses.

15. The method of claim 14, wherein the step of using retrieved values of the MLSE hypotheses and retrieved values of the DFE hypotheses to determine the DFSE metric comprises the steps of:
- determining that a desired DFE hypothesis is not presently stored in the memory;
- determining the desired DFE hypothesis that is not presently stored in the memory;
- storing the determined desired DFE hypothesis into the memory; and
- using the determined desired DFE hypothesis and retrieved values of the MLSE hypotheses to determine the DFSE metric.

16. The method of claim 14, wherein:
- the step of storing one or more tables of DFE hypotheses in the memory comprises the step of storing a number, $M_{DFE}$, of tables of DFE hypotheses in the memory, wherein $M_{DFE}>1$, and wherein each of the $M_{DFE}$ tables of DFE stores a corresponding one of $M_{DFE}$ groups of DFE hypotheses; and
- the step of using retrieved values of the DFE hypotheses to determine the DFSE metric includes the step of using retrieved values of the DFE hypotheses from each of the $M_{DFE}$ tables to determine the DFSE metric.

17. A computer readable storage medium having computer readable program code means embodied therein for determining a Decision Feedback Sequence Estimator (DFSE) metric, the computer readable program code means in said computer readable storage medium comprising:
- computer readable program code means for causing a computer to effect storing one or more tables of Decision Feedback Estimation (DFE) hypotheses in a memory;
- computer readable program code means for causing a computer to effect retrieving DFE hypotheses from the one or more tables of DFE hypotheses;
- computer readable program code means for causing a computer to effect using retrieved values of the DFE hypotheses to determine the DFSE metric; and
- computer readable program code means for causing a computer to effect precalculating the DFE hypotheses and storing the precalculated DFE hypotheses into the memory prior to performance of the step of retrieving DFE hypotheses from the one or more tables of DFE hypotheses.

18. The computer readable storage medium of claim 17, wherein the computer readable program code means for causing a computer to effect using retrieved values of the DFE hypotheses to determine a DFSE metric comprises:
- computer readable program code means for causing a computer to effect determining that a desired DFE hypothesis is not presently stored in the memory;
- computer readable program code means for causing a computer to effect determining the desired DFE hypothesis that is not presently stored in the memory;
- computer readable program code means for causing a computer to effect storing the determined desired DFE hypothesis into the memory; and
- computer readable program code means for causing a computer to effect using the determined desired DFE hypothesis to determine the DFSE metric.

19. The computer readable storage medium of claim 17, wherein:
the computer readable program code means for causing a computer to effect storing one or more tables of Decision Feedback Estimation (DFE) hypotheses in the memory comprises computer readable program code means for causing a computer to effect storing a number, M, of tables of DFE hypotheses in the memory, wherein M>1, and wherein each of the M tables of DFE hypotheses stores a corresponding one of M groups of DFE hypotheses; and the computer readable program code means for causing a computer to effect using retrieved values of the DFE hypotheses to determine the DFSE metric includes computer readable program code means for causing a computer to effect using retrieved values of the DFE hypotheses from each of the M tables to determine the DFSE metric.

20. A computer readable storage medium having computer readable program code means embodied thereon for determining a Decision Feedback Sequence Estimator (DFSE) metric, the computer readable program code means comprising:

computer readable program code means for causing a computer to effect storing a number, $M_{MLSE}$, of tables of Maximum Likelihood Sequence Estimation (MLSE) hypotheses into a memory, wherein $M_{MLSE}>1$;

computer readable program code means for causing a computer to effect retrieving MLSE hypotheses from the $M_{MLSE}$ tables of MLSE hypotheses;

computer readable program code means for causing a computer to effect using retrieved values of the MLSE hypotheses from each of the $M_{MLSE}$ tables of MLSE hypotheses to determine the DFSE metric;

computer readable program code means for causing a computer to effect storing one or more tables of Decision Feedback Estimation (DFE) hypotheses into the memory; and computer readable program code means for causing a computer to effect retrieving DFE hypotheses from the one or more tables of DFE hypotheses, and wherein:

the computer readable program code means for causing a computer to effect using retrieved values of the MLSE hypotheses to determine the DFSE metric comprises computer readable program code means for causing a computer to effect utilizing retrieved values of the MLSE hypotheses and retrieved values of the DFE hypotheses to determine the DFSE metric, and wherein the computer readable storage medium further comprises computer readable program code means for causing a computer to effect precalculating the DFE hypotheses and storing the precalculated DFE hypotheses into the memory prior to performance of the step of retrieving DFE hypotheses from the one or more tables of DFE hypotheses.

21. The computer readable storage medium of claim 20, wherein the computer readable program code means for causing a computer to effect using retrieved values of the MLSE hypotheses and retrieved values of the DFE hypotheses to determine the DFSE metric comprises:

computer readable program code means for causing a computer to effect determining that a desired DFE hypothesis is not presently stored in the memory;

computer readable program code means for causing a computer to effect determining the desired DFE hypothesis that is not presently stored in the memory;

computer readable program code means for causing a computer to effect storing the determined desired DFE hypothesis into the memory; and computer readable program code means for causing a computer to effect using the determined desired DFE hypothesis and retrieved values of the MLSE hypotheses to determine the DFSE metric.

22. The computer readable storage medium of claim 20, wherein:

the computer readable program code means for causing a computer to effect storing one or more tables of DFE hypotheses in the memory comprises computer readable program code means for causing a computer to effect storing a number, $M_{DFE}$, of tables of DFE hypotheses in the memory, wherein $M_{DFE}>1$, and wherein each of the $M_{DFE}$ tables of DFE stores a corresponding one of $M_{DFE}$ groups of DFE hypotheses; and the computer readable program code means for causing a computer to effect using retrieved values of the DFE hypotheses to determine the DFSE metric includes computer readable program code means for causing a computer to effect using retrieved values of the DFE hypotheses from each of the $M_{DFE}$ tables to determine the DFSE metric.

* * * * *